United States Patent
Kim et al.

(10) Patent No.: US 8,735,895 B2
(45) Date of Patent: May 27, 2014

(54) ELECTRONIC DEVICE INCLUDING GRAPHENE THIN FILM AND METHODS OF FABRICATING THE SAME

(75) Inventors: Tae-Whan Kim, Mapo-gu Seoul (KR); Won-il Park, Nowon-gu Seoul (KR); Dong-Ick Son, Mapo-gu Seoul (KR); Jae-Ho Shim, Gangneung-si (KR); Jung-Min Lee, Seoul (KR); Jae-Hun Jung, Seoul (KR)

(73) Assignees: Samsung Electronics Co., Ltd., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 255 days.

(21) Appl. No.: 12/902,783

(22) Filed: Oct. 12, 2010

(65) Prior Publication Data

US 2011/0101365 A1 May 5, 2011

(30) Foreign Application Priority Data

Oct. 30, 2009 (KR) .................. 10-2009-0104085

(51) Int. Cl.
*H01L 29/10* (2006.01)

(52) U.S. Cl.
USPC .................................. 257/66; 257/E29.273

(58) Field of Classification Search
CPC ............ H01L 29/00; H01L 31/022466; H01L 29/78684
USPC ........................................... 257/66, E29.273
See application file for complete search history.

(56) References Cited

U.S. PATENT DOCUMENTS

| 2009/0146111 | A1* | 6/2009 | Shin et al. ..................... 252/510 |
| 2009/0218935 | A1* | 9/2009 | Sotoyama et al. ............ 313/504 |
| 2011/0068320 | A1* | 3/2011 | Marinero et al. ................. 257/9 |

FOREIGN PATENT DOCUMENTS

KR   10-2009-0010758 A   1/2009

OTHER PUBLICATIONS

Ma et al., Organic electrical bistable devices and rewritable memory cells, Apr. 22, 2002,Applied Physics Letterss, vol. 80, No. 16, pp. 2997-2999.*
English translation of Korean patent application publication (Lee et al. KR-10-2009-0010758-A, Jan. 30, 2009, Samsung Electronics Co., Ltd.).*
Reina et al., "Transferring and Identification of Single- and Few-Layer Graphene on Arbitrary Substrates", The Journal of Physical Chemistry Letters, Oct. 24, 2008, vol. 112, pp. 17741-17744.
Reina et al., "Large Area, Few-Layer Graphene Films on Arbitrary Substrates by Chemical Vapor Deposition", Nano Letters, 2009, vol. 9, No. 1, pp. 30-35.

* cited by examiner

*Primary Examiner* — Shaun Campbell
(74) *Attorney, Agent, or Firm* — Harness, Dickey & Pierce, P.L.C.

(57) ABSTRACT

Provided are an electronic device and methods of fabricating the same, the electronic device include a device-substrate, a stacked structure, and an electrode. The stacked structure includes a graphene thin film between a first insulator and a second insulator. The electrode is disposed over the stacked structure.

14 Claims, 10 Drawing Sheets

ELECTRONIC DEVICE INCLUDING GRAPHENE THIN FILM AND METHODS OF FABRICATING THE SAME

CROSS-REFERENCE TO RELATED APPLICATIONS

This U.S. non-provisional patent application claims priority under 35 U.S.C. §119 of Korean Patent Application No. 10-2009-0104085, filed on Oct. 30, 2009, the entire contents of which are hereby incorporated by reference.

BACKGROUND

1. Field

Example embodiments of the present inventive concepts herein relate to an electronic device and methods of fabricating the same, and more particularly, to an electronic device including a graphene thin film and methods of fabricating the same.

2. Related Art

Memory devices storing and reading information using a difference in current size according to the storage state of electric charges, electronic devices converting electricity into light (e.g., light emitting devices that covert electricity into light) or converting light into electricity (e.g., solar cells and photodetectors that convert light into electricity), etc., will be referred to as electronic devices throughout this disclosure.

Graphene is a material having a structure in which carbon atoms are two-dimensionally combined like graphite. Unlike graphite, however, the graphene is formed very thinly in a single layer, or in multiple-layers (e.g., two or three layers). Because graphene is flexible and transparent and has a high electrical conductivity, graphene is considered a promising material for use as a flexible electrode or a material for electron transfer in the next generation of electronic devices.

The use of graphene for forming an electron transport layer or a transparent electrode of an electronic device using the photovoltaic principle that converts light into electricity (similar to solar cells and photodetectors) is receiving great attention. While indium tin oxide (ITO) is being widely used to form transparent electrodes of electronic devices, the manufacturing costs associated with ITO have increased due to the increasing high costs and limited availability of indium (In). Furthermore, it is difficult to use ITO in flexible devices due to its lack of flexibility.

Typical methods for manufacturing a graphene thin film for transparent electrodes can be divided into methods for manufacturing a thin film by purifying graphite using a catalyst, and wet methods using graphene oxide. A method for manufacturing a graphene thin film by purifying graphite involves covering graphite adhered on a substrate with a catalyst, and then covering the resultant structure with polymers and performing a heat treatment to obtain graphene from graphite. Then, the substrate is removed, and a graphene thin film is obtained. A wet method using graphene oxide involves oxidizing graphene, mixing and diffusing the oxidized graphene in a solution, followed by spin coating the graphene solution to directly form an electrode or electron transport layer.

Methods that use graphite and a catalyst can be used to obtain a high-quality graphene thin film, but involve fairly complicated processing. Because methods that use oxidized graphene can use typical polymer processing (such as spin coating), the methods can easily form graphene thin films having a large surface area through fairly simple processes. However, because oxidized graphene is used, the electrical characteristics are inferior compared to the use of pure graphene. Because a thin film is formed in separate small pieces instead of a unified single thin film, the characteristics for a transparent electrode are inferior compared to a typical ITO.

Recently, there has been proposed a method of fabricating a device, which involves coating and heat-treating a polymer on a substrate to convert the polymer into graphene. Additionally, there has been proposed a method of fabricating a device, which involves supplying a vapor carbon supply source to grow graphene, then separating the graphene from the substrate to form a sheet-shape, and moving the graphene sheet to a device-substrate to manufacture a device. However, because graphene is very thin, graphene may easily be damaged when moving or handling the graphene in order to attach structures to on the graphene opposed to during the process of manufacturing graphene.

Accordingly, studies are being conducted on technology such as a method involving forming poly methyl methacrylate (PMMA) on manufactured graphene and then moving the PMMA and graphene layers onto a desired structure in order to move (or transfer) the manufactured graphene thin film onto the desired structure. This technology involves depositing PMMA on graphene over a substrate and simultaneously-separating the PMMA and graphene layers from the substrate by removing the substrate. Thereafter, the PMMA and graphene layers are attached onto a desired structure, and then PMMA is removed so as to prevent physical damage of the graphene. To this end, however, the entire process for manufacturing a device increases because an etching process for removing PMMA, after deposition of PMMA on graphene, is necessary. Also, graphene may be damaged in the course of chemically removing PMMA.

SUMMARY

Example embodiments of the present inventive concepts herein relate to an electronic device and methods of fabricating the same, and more particularly, to an electronic device including a graphene thin film and methods of fabricating the same.

Example embodiments of the inventive concepts provide an electronic device including a graphene thin film with increased electrical characteristics and a method of fabricating the electronic device using a sheet-shaped graphene thin film.

An example embodiment of the inventive concepts provides an electronic device including a device-substrate, a stacked structure including a graphene thin film between a first insulator and a second insulator, and an electrode over the stacked structure.

In some embodiments, the electronic devices may further include a bottom electrode between the device-substrate and the stacked structure. The bottom electrode may include at least one of indium tin oxide (ITO), Al-doped ZnO (AZO), Ga-doped ZnO (GZO), Mg-doped ZnO (MGO), Mo-doped ZnO, In, Ga-codoped ZnO (IGZO), graphene and combinations thereof. The first insulator and the second insulator may include at least one of poly vinyl pyrrolidone (PVP), polystyrene (PS), poly methyl methacrylate (PMMA), polyimide (PI) and combinations thereof. Thus, when organic materials are used as the first insulator and the second insulator, the electronic device may be realized as an organic bistable memory device.

According to yet another example embodiment, an electronic device includes a first insulator over a device-substrate, a graphene thin film over the first insulator, a second insulator over the graphene thin film, the graphene thin film being mounted to one of the first insulator and the second insulator, and an electrode over the second insulator.

In another example embodiment of the inventive concepts, a method of fabricating an electronic device includes forming a graphene thin film of a sheet-shape with a first insulator, attaching the graphene thin film with the first insulator onto a device-substrate, forming a second insulator over the graphene thin film, and forming an electrode over the second insulator. The first insulator is interposed between the graphene thin film and the device-substrate.

In still another example embodiment of the inventive concepts, methods of fabricating an electronic device include forming a first insulator over a device-substrate, forming a graphene thin film of a sheet-shape with a second insulator, attaching the graphene thin film with the second insulator onto the first insulator, and forming an electrode on (or over) the second insulator. The graphene thin film is disposed between the first insulator and the second insulator.

In some example embodiments, the formation of the graphene thin film may include loading a substrate with a graphite metal layer into a chamber, heating the graphite metal layer by a heat transfer effect generated by allowing a current to flow in at least one of the graphite metal layer and the substrate in the chamber, dissolving carbon ingredients in the graphite metal layer by supplying a vapor carbon supply source in the chamber while the graphite metal layer is being heated, extracting graphene from the dissolved carbon ingredients to the graphite metal layer surface by cooling the graphite metal layer at a controlled rate by controlling the amount of the current, and separating the extracted graphene from the substrate by removing the graphite metal layer through an acid treatment.

According to yet still another example embodiment, a method of fabricating an electronic device include mounting a graphene thin film of a sheet-shape to one of a first insulator and a second insulator, attaching the graphene thin film onto a device-substrate, and forming an electrode over the second insulator. The graphene thin film is disposed between the first insulator and the second insulator.

In some example embodiments, if the graphene thin film is mounted to the first insulator, then the second insulator is formed over the graphene thin film attached to the device-substrate prior to the formation of the electrode and after attaching the graphene thin film onto the device-substrate.

In other example embodiments, if the graphene thin film is mounted to the second insulator, then the first insulator is formed over the device-substrate prior to attaching the graphene thin film onto the device-substrate.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1A:
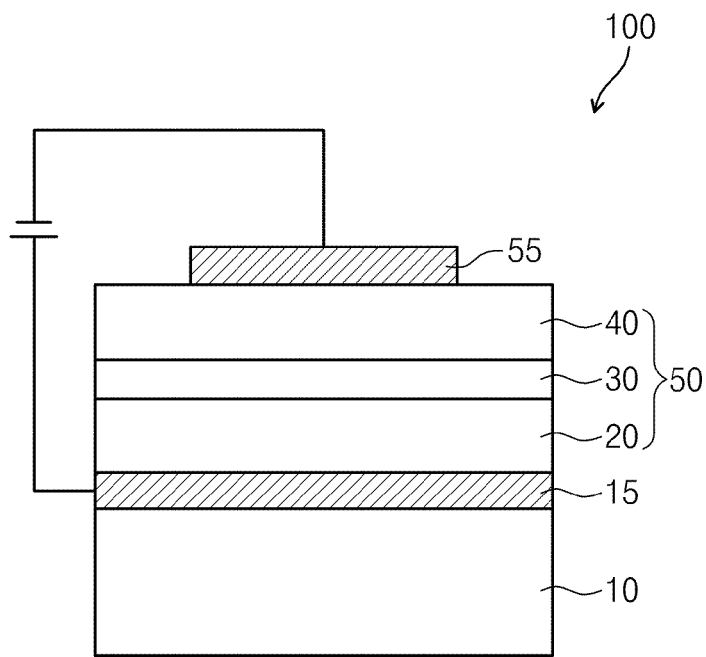
FIGS. 1A and 1B are cross-sectional views illustrating an electronic device according to an example embodiment of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments of the inventive concept will be described below in more detail with reference to the accompanying drawings. The inventive concept may, however, be embodied in different forms and should not be construed as limited to the embodiments set forth herein. Rather, these example embodiments are provided so that this disclosure will be thorough and complete, and will fully convey the scope of the inventive concept to those skilled in the art.

Example embodiments of the present inventive concepts herein relate to an electronic device and methods of fabricating the same, and more particularly, to an electronic device including a graphene thin film and methods of fabricating the same.

Figure 1B:
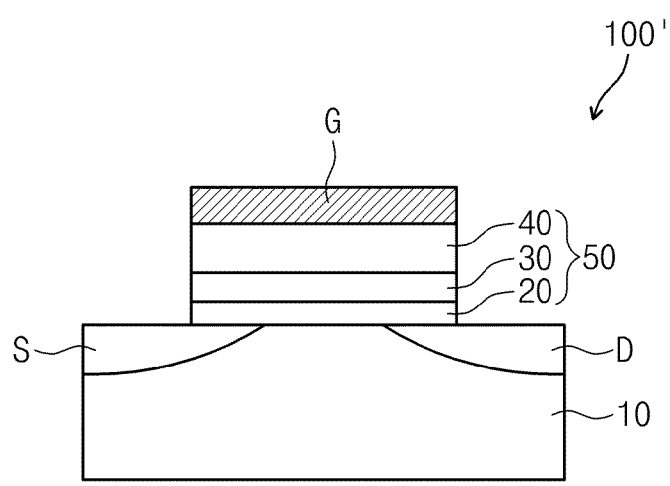

FIGS. 1A and 1B are cross-sectional views illustrating an electronic device according to an example embodiment of the inventive concepts.

Referring to FIGS. 1A and 1B, electronic devices 100 and 100' according to an example embodiment of the inventive concepts may include a stacked structure 50, which includes a graphene thin film 30 disposed between a lower insulator 20 and an upper insulator 40, on a device-substrate 10.

The device 100 shown in FIG. 1A, which is a bistable memory device, may further include a bottom electrode 15 under the sandwich structure 50 and a top electrode 55 on the sandwich structure 50. The bottom electrode 15 may include at least one of indium tin oxide (ITO), Al-doped ZnO (AZO), Ga-doped ZnO (GZO), Mg-doped ZnO (MGO), Mo-doped ZnO, In, Ga-codoped ZnO (IGZO), graphene and combinations thereof. The lower and top electrodes 15 and 55 may be transparent electrodes.

The device 100' shown in FIG. 1B, which is a flash memory device, may further include a source S and a drain D under the sandwich structure 50 and a control gate electrode G on the sandwich structure 50. The top electrode 55 and the control gate electrode G may be at least one of Al, Au, Cu, Pt, Ag, W, Ni, Zn, Ti, Zr, Hf, Cd, Pd, graphene, alloys and combinations thereof.

The above electrodes 15, 55, and G may be formed by various thin film deposition methods such as sputtering, chemical vapor deposition (CVD), and physical vapor deposition (PVD), or may be formed by a method of physically attaching graphene of a sheet-shape.

The device-substrate 10, which may be a typical substrate for semiconductors, may include a transparent inorganic substrate such as glass, quartz, $Al_2O_3$, or SiC, a transparent organic substrate such as polyethylene terephthalate (PET), polystyrene (PS), polyimide (PI), polyvinyl chloride (PVC), poly vinyl pyrrolidone (PVP), polyethylene (PE) or combinations thereof, or a substrate such as Si, Ge, GaAs, InP, InSb, InAs, AlAs, AlSb, CdTe, ZnTe, ZnS, CdSe, CdSb, GaP or combinations thereof. When a plastic substrate such as PET is used for the device-substrate 10, the electronic devices 100 and 100' may be manufactured as a flexible device.

As the graphene thin film 30 having high electrical conductivity is used to store electric charges, the electronic devices 100 and 100' may be manufactured as flexible devices, and may utilize the excellent characteristics of graphene. The lower insulator 20 and the upper insulator 40 may be typical inorganic insulators or organic insulators such as polymer materials. When the device-substrate 10, the lower insulator 20, and the upper insulator 40 are organic materials, the electronic devices 100 and 100' may become flexible organic devices. Accordingly, the lower insulator 20 and the upper insulator 40 may be at least one of PVP, PS, PMMA, PI and combinations thereof.

Figure 2:
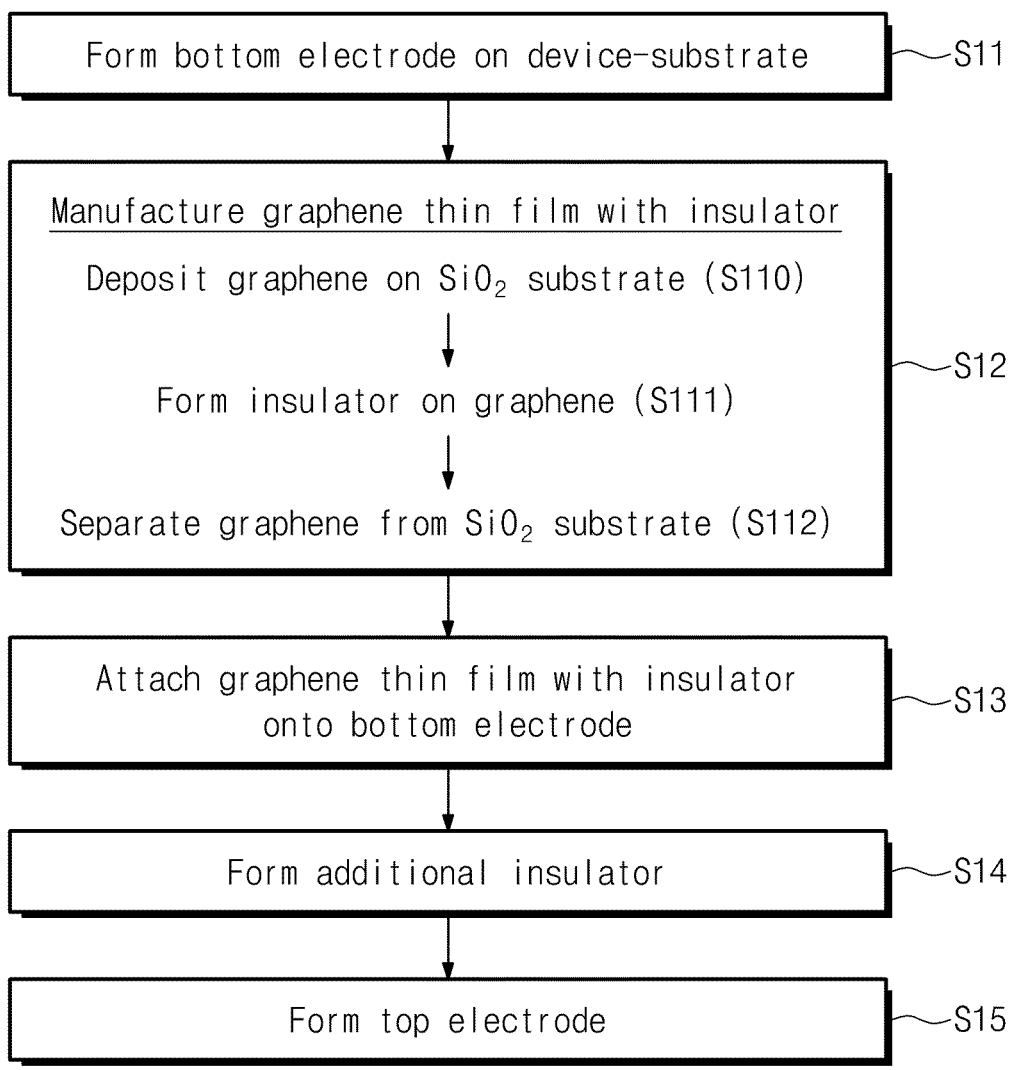
FIG. 2 is a flowchart illustrating a method of fabricating an electronic device according to another example embodiment of the inventive concepts.

FIG. 2 is a flowchart illustrating a method of fabricating an electronic device according to another example embodiment of the inventive concepts. FIG. 3A to FIG. 3E are cross-sectional views illustrating the method of FIG. 2.

Hereinafter, a method of fabricating the electronic device of FIG. 1A will be described in detail with reference to FIG. 2 and FIG. 3A to 3E.

Figure 3A:
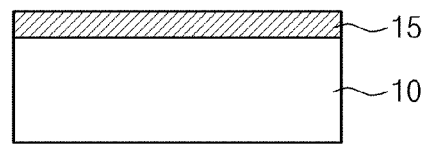
FIG. 3A to FIG. 3E are cross-sectional views illustrating the method according to the flowchart of FIG. 2.

In operation S11 of FIG. 2 and FIG. 3A, a bottom electrode 15 may be formed on a device-substrate 10. For example, ITO may be deposited on a PET substrate as the device-substrate 10 by a sputtering process to form the bottom electrode 15.

Figure 3B:
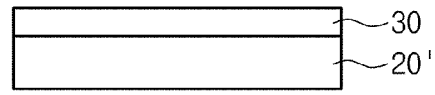

In operation S12 of FIG. 2 and FIG. 3B, a graphene thin film 30 (shown in FIG. 3C) of a sheet-shape having an insulator 20' thereon may be formed to be used in the electronic device 100. Here, the order of the operations S11 and S12 may be changed.

In operation S110 of FIG. 2, graphene may be formed on a $SiO_2$-substrate (not shown). To form graphene, the $SiO_2$ substrate deposited with Ni may be put into a chemical vapor deposition (CVD) chamber, and then hydrogen and argon gases may be filled at an appropriate ratio of about 1:4. $CH_4$ gas which is a vapor carbon supply source, and hydrogen-argon mixed gas may be allowed to flow for about 30 seconds at a high temperature under a constant atmospheric pressure, and then the inside of the chamber may be slowly cooled to a normal temperature. In this process, graphene may be grown on Ni.

In operation S111 of FIG. 2, an insulator 20' may be formed on the graphene formed in the operation S110. The insulator 20' may be a typical inorganic insulator and/or organic insulator such as a polymer material. The insulator 20' may be formed by methods such as deposition and spin coating. For example, PMMA may be formed by spin coating.

In operation S112 of FIG. 2, the graphene thin film 30 having the insulator 20' formed thereon may be separated from the $SiO_2$ substrate. To this end, the $SiO_2$ substrate may be sequentially dipped in HF solution and Ni etching solution to etch $SiO_2$ and Ni. Thus, the insulator 20' and the graphene thin film 30 may be completely extracted in a sheet-shape while adhering (or mounted) to each other. TFB or TFG solution may be used as Ni etching solution.

Figure 3C:
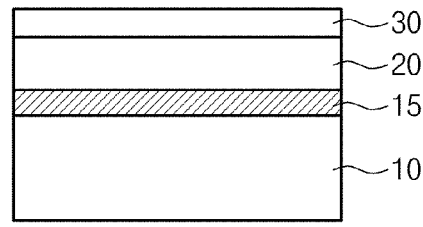

In operation S13 of FIG. 2 and FIG. 3C, the graphene thin film 30 having the insulator 20' formed thereon, which has been obtained in the operation S12, may be attached onto the bottom electrode 15 formed in the operation S11 such that the insulator 20' faces the bottom electrode 15. The insulator 20' may become a lower insulator 20 in the electronic device 100. That is, a structure of the insulator 20'/graphene thin film 30, similar to a typical structure of PMMA/graphene used in movement after the growth of graphene, may be utilized just for a manufacturing process of a device. In a typical method, after a PMMA/graphene structure is moved to a device-substrate, PMMA is removed. Thereafter, if PMMA is necessary, PMMA has to be formed again. In contrast, in the above method according to the example embodiment of the inventive concepts, the insulator 20' formed for protection of the graphene thin film 30 may be used in a device as it is, thereby reducing the manufacturing process and costs.

Figure 3D:
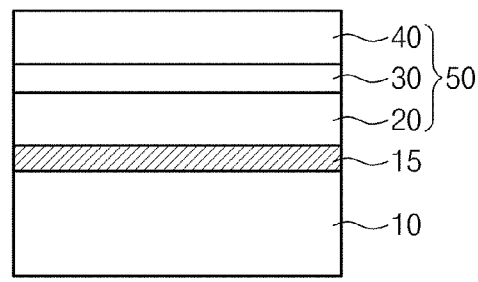

In operation S14 of FIG. 2 and FIG. 3D, an upper insulator 40 may be formed on the graphene thin film 30. Thus, a sandwich structure 50 including the graphene thin film 30 between the lower insulator 20 and the upper insulator 40 may be formed.

Similar to the lower insulator 20, the upper insulator 40 may be a typical inorganic insulator and organic insulator such as a polymer material. The upper insulator 40 and the lower insulator 20 may include the same materials or different materials. The upper insulator 40 and the lower insulator 20 may be formed by methods such as deposition and spin coating.

Figure 3E:
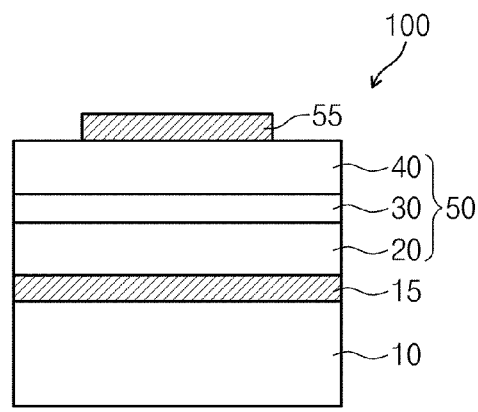

In operation S15 of FIG. 2 and FIG. 3E, a top electrode 55 may be formed on the upper insulator 40, and then a circuit may be connected thereto to complete the electronic device 100.

The methods according to the example embodiment of the inventive concepts can assure safe movement of the graphene thin film 30 using the structure of the insulator 20'/graphene thin film 30. Because the structure of the insulator 20'/ graphene thin film 30 is used as it is for safe movement of the graphene thin film 30 in the manufacturing of a memory device including the sandwich structure 50 with the graphene thin film 30 between the insulators 20 and 40, only one additional insulator may be further formed. Accordingly, the reliability and productivity of the device are increase.

Figure 4:
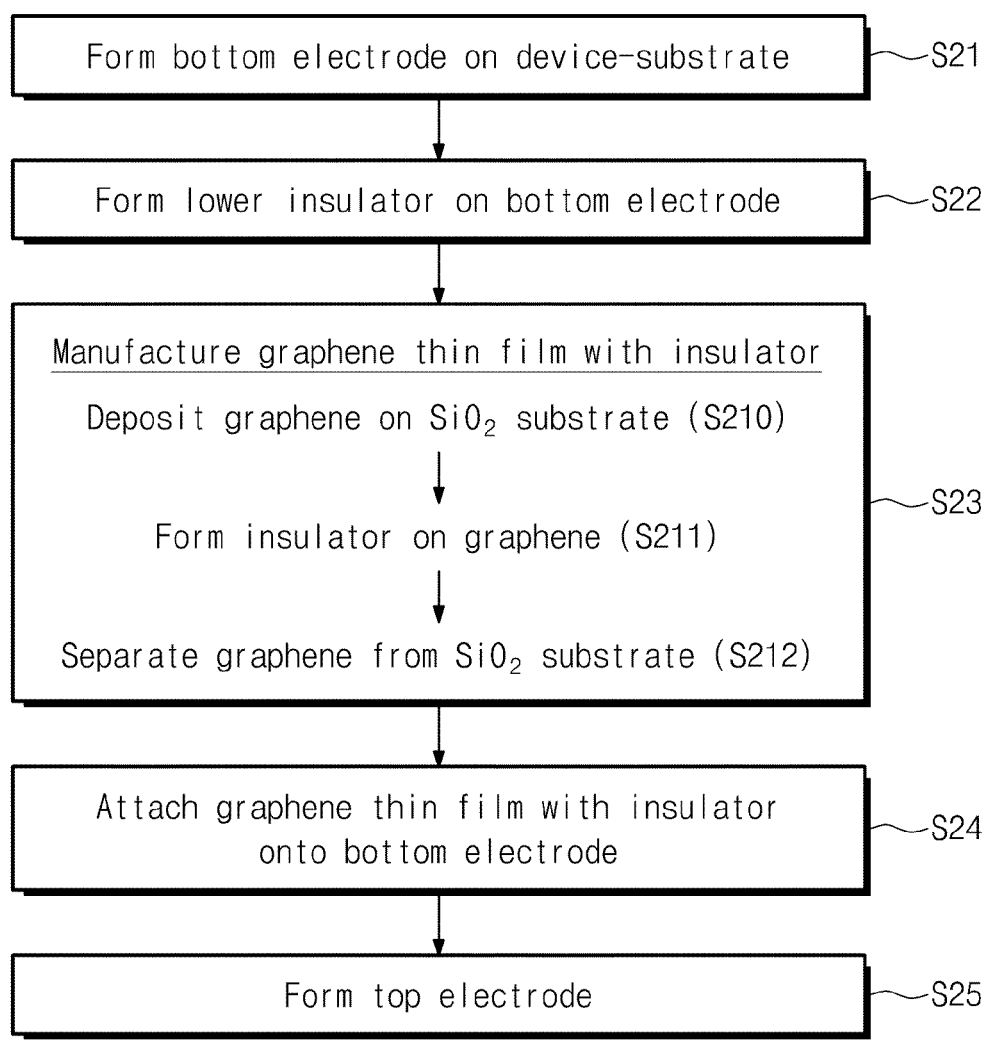
FIG. 4 is a flowchart illustrating a method of fabricating an electronic device according to yet another example embodiment of the inventive concepts.

FIG. 4 is a flowchart illustrating a method of fabricating the electronic device of FIG. 1A according to yet another example embodiment of the inventive concepts. FIG. 5A to FIG. 5E are cross-sectional views illustrating the method of FIG. 4.

Referring to FIG. 4 and FIGS. 5A to 5E, the method of fabricating the electronic device of FIG. 1A will be described in detail with reference to FIG. 4 and FIGS. 5A to 5E.

Figure 5A:
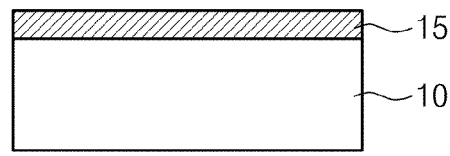
FIG. 5A to FIG. 5E are cross-sectional views illustrating the method according to the flowchart of FIG. 4.

In operation S21 of FIG. 4 and FIG. 5A, a bottom electrode 15 may be formed on a device-substrate 10. This process may be similar to that of the operation S11 described with reference to FIG. 2.

Figure 5B:
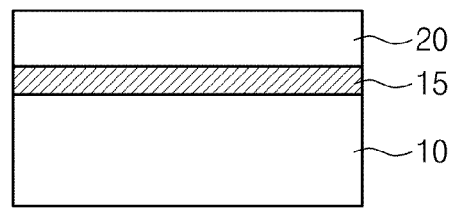

In operation S22 of FIG. 4 and FIG. 5B, a lower insulator 20 may be formed on the bottom electrode 15.

Figure 5C:
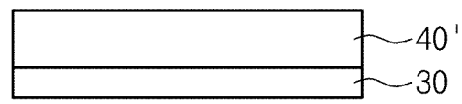

In operation S23 of FIG. 4 and FIG. 5C, a graphene thin film 30 having a sheet-shape and having an insulator 40' thereon may be manufactured to be used in the electronic device 100. Here, the order of the operations S21 and S22 and the operation S23 may be changed.

In operation S210 of FIG. 4, graphene may be formed on a $SiO_2$-substrate (not shown). This process may be similar to that of the operation S110 described with reference to FIG. 2.

In operation S211 of FIG. 4, an insulator 40' may be formed on the graphene formed from operation S110. The insulator 40' may be a typical inorganic insulator and/or organic insulator such as a polymer material. The insulator 40' may be formed by methods such as deposition and spin coating. For example, PMMA may be formed by spin coating.

In operation S212 of FIG. 4, the graphene thin film 30 having the insulator 40' formed thereon may be separated from the $SiO_2$ substrate. To this end, the $SiO_2$ substrate may be sequentially dipped in HF solution and Ni etching solution to etch $SiO_2$ and Ni. Thus, the insulator 20' and the graphene thin film 30 may be completely extracted in a sheet-shape while the insulator 40' and the graphene thin film 30 are adhering (or mounted) to each other. TFB or TFG solution may be used as Ni etching solution.

Figure 5D:
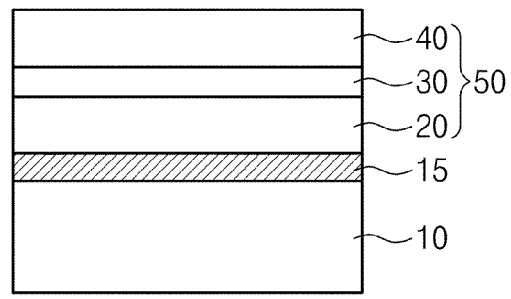

In operation S24 of FIG. 4 and FIG. 5D, the graphene thin film 30 having the insulator 40,' which has been formed in operation S23, may be attached onto the lower insulator 20 formed in the operation S22 such that the graphene thin film 30 faces the lower insulator 20. The insulator 40' may become an upper insulator 40 in the electronic device 100. Thus, a sandwich structure 50 including the graphene thin film 30 between the lower insulator 20 and the upper insulator 40 may be formed.

Figure 5E:
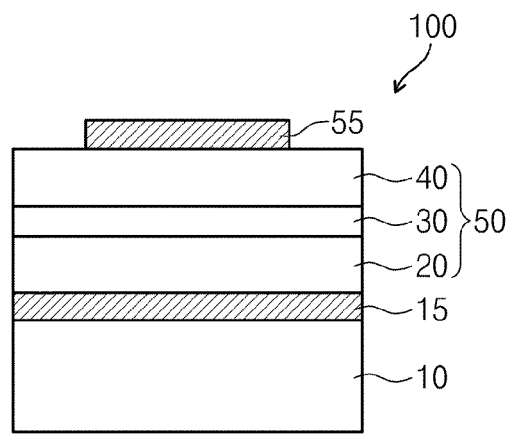

In operation S25 of FIG. 4 and FIG. 5E, a top electrode 55 may be formed on the upper insulator 40, and then a circuit may be connected thereto to complete the electronic device 100.

In the previous example embodiment, after the structure of the insulator 20'/graphene thin film 30 is formed, the insulator 20'/graphene thin film 30 is turned over to be applied to the device-substrate 10. In the present example embodiment, however, after a structure of the insulator 40'/graphene thin film 30 is formed, the insulator 40'/graphene thin film 30 may be applied to the device-substrate 10 as it is. Except the above description, other configurations of the present example embodiment may be similar to those of the previous example embodiment. Even in the present example embodiment, because the insulator 40' formed for protection of the graphene thin film 30 is used in manufacturing a device as it is, the process can be simplified and the costs thereof can be reduced.

On the other hand, the electronic device 100' of FIG. 1B may also be easily manufactured by using the above methods. But, the only difference is that a source S or a drain D may be formed in the device-substrate 10 before or after the sandwich structure 50 of insulator 20/graphene thin film 30/insulator 40 is formed.

It has been described in the above example embodiment that the graphene thin film is formed by growing graphene on a $SiO_2$ substrate deposited with Ni, but base materials for forming the graphene thin film are not limited to the $SiO_2$ substrate. The growth of graphene may be performed by a typical CVD, but a method described below may allow a higher quality of graphene thin film to be formed, and therefore can increase the quality of a device using the graphene thin film as an electrode.

Hereinafter, the method will be described in detail with reference to the accompanying drawings.

Figure 6:
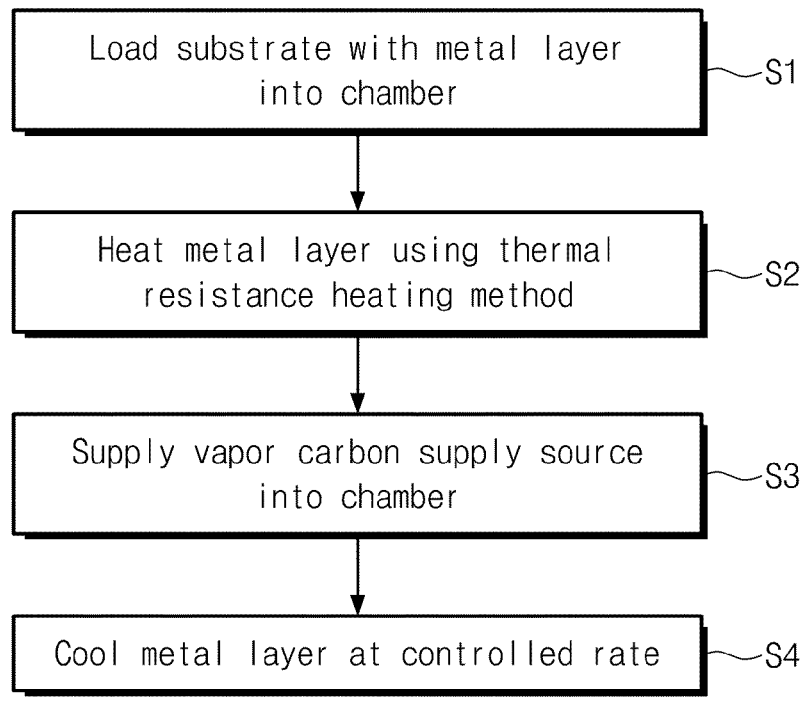
FIG. 6 is a flowchart illustrating a process of obtaining a graphene thin film to be used in fabricating an electronic device according to still another example embodiment of the inventive concepts.
Figure 7:
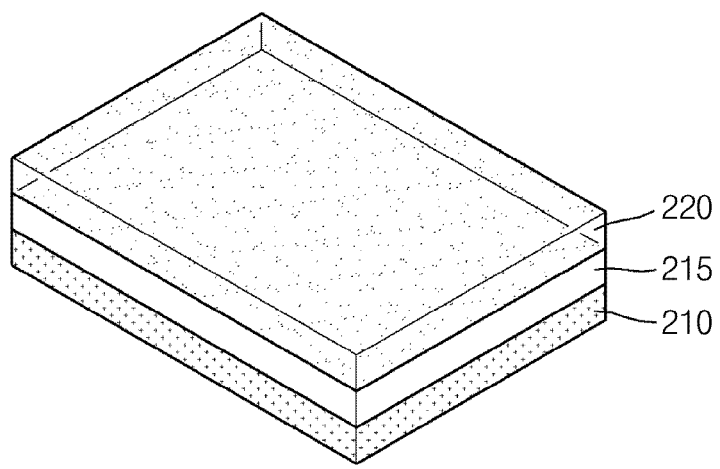
FIGS. 7 through 9 are views illustrating the process according to the flowchart of FIG. 6.
Figure 8:
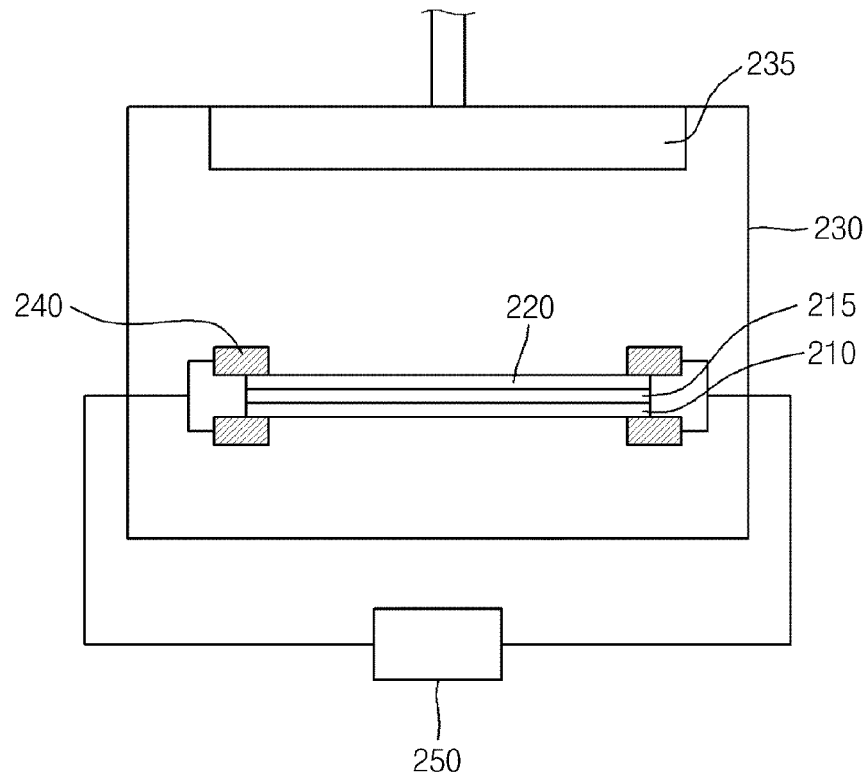
Figure 9:
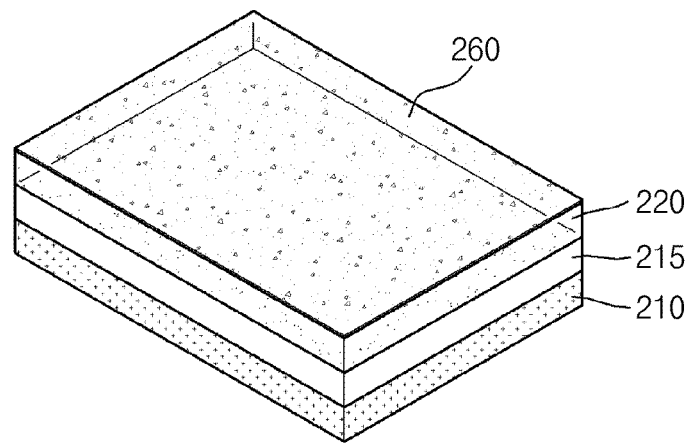

FIG. 6 is a flowchart illustrating a process of obtaining a graphene thin film to be used in fabricating an electronic device according to still another example embodiment of the inventive concepts. FIGS. 7 through 9 are diagrams illustrating the process according to the flowchart of FIG. 6.

In operation S1 of FIG. 6, a substrate 210 having a graphite metal layer 220 formed thereon is prepared as shown in FIG. 7, and loaded into a chamber 230 as shown in FIG. 8.

The chamber 230 may include a gas feeder 235 that may supply various gases to the substrate 210 to perform a CVD process basically. The gas feeder 235 may be configured with a shower head that is used as a typical gas feeder, but the example embodiment is not limited thereto. After the substrate 210 formed with the graphite metal layer 220 is loaded into the chamber 230, air in the chamber 230 may be removed by, for example, a pump (not shown). Thereafter, while maintaining a vacuum state, an appropriate atmospheric gas (for example, hydrogen and argon gases) may be allowed to flow at a ratio of about 1:1 to about 1:6 to maintain a normal pressure.

The substrate 210 may serve as an auxiliary means for forming a graphene thin film, and therefore the material of the substrate 210 does not matter. However, the substrate 210 may need to endure a heating temperature of about 1,000° C. in a subsequent process, and may need to be formed of a material that can easily be removed by an acid treatment to obtain a graphene thin film of a sheet-shape separated from the substrate. As a cost-saving material of the substrate 210 that may satisfy the above characteristics and may easily be obtained, a doped or undoped silicon substrate may be employed in the present example embodiment. Here, a silicon oxide 215 may be disposed on the silicon substrate, and then a graphite metal layer 220 may be disposed thereon.

The graphite metal layer 220 may include a graphite metal catalyst that serves to allow carbon ingredients to combine with each other to form a planar structure having a hexagonal shape. For example, the graphite metal catalyst may include catalysts used in synthesizing graphite, in inducing a carbonizing reaction, or in manufacturing a carbon nanotube. More specifically, the graphite metal catalyst may include one or more metals or alloys selected from the group consisting of Ni, Co, Fe, Pt, Au, Al, Cr, Cu, Mg, Mn, Mo, Rh, Si, Ta, Ti, W, U, V, Zr and combinations thereof.

The graphite metal layer 220 may be formed by dissolving a metal complex or metal alkoxide in a solvent such as alcohol, spreading the dissolved complex or alkoxide on the substrate 210, and then drying the complex or alkoxide. Alternatively, the graphite metal layer 220 may also be formed through a metal deposition method such as thermal deposition on the substrate 210.

Particularly, electrodes 240 may be installed around the both ends of the substrate 210 in the chamber 230 used in the present example embodiment. The electrodes 240 may be connected to a power source (direct current or alternating current power source) 250 outside the chamber 230. As shown in FIG. 7, the electrodes 240 may contact the substrate 210 having the graphite metal layer 220 thereon. In this case, when the substrate 210 is non-conductive like an undoped silicon substrate, a current may be allowed to flow through the graphite metal layer 220. When the substrate 210 is conductive like a doped silicon substrate, a current may be allowed to flow through at least one of the graphite metal layer 220 and the substrate 210. For example, the current may flow through both the graphite metal layer 220 and the substrate 210. The electrodes 240 shown in FIG. 7 may be two pairs of electrodes extending along two sides of the substrate 210 opposite to each other at the both upper and lower ends of the substrate 210, but the example embodiment is not limited thereto. Accordingly, any structure that allows an electric current to evenly flow through the graphite metal layer 220 and/or the substrate 210 may be employed.

In operation S2 of FIG. 6, the graphite metal layer 220 may be heated by a heat transfer effect by allowing a current to flow through at least one of the graphite metal layer 220 and/or the substrate 210 in the chamber 230 while maintaining a normal pressure. That is, the temperature of the graphite metal layer 220 may be increased by a thermal resistance heating method. The temperature may be increased to about 600° C. to about 1,000° C. Due to this heating effect, the particle size of the graphite metal layer 220 may increase, and the surface of the graphite metal layer 220 may be flattened.

As described above, power feeding to the graphite metal layer 220 and/or the substrate 210 may be enabled by contacting the electrodes 240 of the chamber 230 with the substrate 210, where the heat transfer effect may heat the graphite metal layer 220. When the substrate 210 is non-conductive, application of an electric current to the graphite metal layer 220 may directly generate heat to increase its temperature. Because the metal catalyst is formed in a layer shape, and the electrodes 240 contact the both ends of the substrate 210, a current may almost evenly flow over the entire surface of the graphite metal layer 220. Thus, the entire graphite metal layer 220 may be almost evenly heated by the heat transfer effect without a complex control, only by allowing a current to flow in the graphite metal layer 220. When the substrate is conductive, application of an electric current to the substrate 210 may allow the substrate 210 to generate heat, and the graphite metal layer 220 thereon may easily be heated.

In this process, the size of the metal particles forming the graphite metal layer 220 may increase due to an additional effect by an electric field formed by the flowing current as well as the heat effect, and thus the surface of the graphite metal layer 220 may be considerably flattened. In a subsequent process, graphene may be formed over the flattened graphite metal layer 220, thereby increasing the quality.

In operation S3 of FIG. 6, carbon ingredients may be dissolved in the graphite metal layer 220 by supplying a vapor carbon supply source to the chamber 230 through the gas feeder 235 in a state where the graphite metal layer 220 is heated.

The vapor carbon supply source may include hydrocarbon gases such as ethane, ethylene, ethanol, acetylene, propane, propylene, butane, butadiene, pentane, and hexane. Particularly, the vapor carbon supply source may include $CH_4$ gas, and hydrogen may be further supplied along with the vapor carbon supply source. That is, while a mixed gas of hydrogen-argon is continuously supplied to maintain a normal temperature of the chamber 230, $CH_4$ gas as a vapor carbon supply source may be supplied in the above process. It may be possible to adjust the amount of the carbon ingredients dissolved in the graphite metal layer 220 by controlling the heating temperature and time and the supply quantity of the vapor carbon supply source. When the amount of the dissolved carbon ingredients is increased by increasing the heating time and the supply quantity of the vapor carbon supply source, the thickness of the graphene thin film may increase as a result. When the amount of the dissolved carbon ingredients is reduced by reducing the heating time and the supply quantity of the vapor carbon supply source, the thickness of the graphene thin film may decrease. When the amount of time is increased for a small supply quantity of the vapor carbon supply source, a desired amount of carbon ingredients may be dissolved.

In a treatment of a substrate requiring heating, generally, methods for indirectly heating a substrate using a resistance heater or a radiant heat of a lamp are being widely used. In recent years, due to the increasing sizes of thin film displays or increasing demand on cost-saving solar cell panels, graphene thin films are also required to increase in size. In order to obtain such a large-sized graphene thin film, the substrate 210, as a base material on which graphene thin film is formed, may need to be increased in size. However, typical methods for indirectly heating a substrate using a resistance heater or a radiant heat of a lamp may increase the manufacturing costs may increase because the sizes of the heater and the like need to be increased.

However, because the substrate 210 and/or the graphite metal layer 220 are directly heated by application of an electric current through a thermal resistance heating method, it is possible to efficiently heat by a fairly simple configuration, and the manufacturing costs may not increase. Also, it is possible to heat the graphite metal layer 220 even when the substrate is non-conductive as well as conductive.

In operation S4 of FIG. 6, graphene may be extracted from the carbon ingredients dissolved in the graphite metal layer 220 to the surface of the graphite metal layer 220 to form a graphene thin film 260 as shown in FIG. 9, by stopping the supply of the vapor carbon supply source and reducing the amount of the flowing current in the thermal resistance heating method to cool the graphite metal layer 220 at a controlled rate.

The above cooling process is an important process for obtaining a high-quality graphene thin film 260 by evenly extracting graphene. A rapid cooling may cause deficiency in a desired thickness or cracks in the generated graphene thin film. The slow cooling may cause excessive thickness of the graphene, or may cause a reduction in the production. Accordingly, it is desirable to cool at a controlled constant rate. The cooling rate may range from about 1° C. to about 50° C. per second, and more desirably, the cooling rate may be about 10° C. per second.

Cooling after layer formation may be normally performed by a method of flowing inert gases or a natural cooling method. However, because the radiant heat may be controlled by the adjustment of the amount of current in the present example embodiment, the cooling rate of the graphite metal layer 220 may be exactly controlled to grow a high-quality graphene.

Next, the graphene thin film 260 may be separated from the substrate 210 by removing the graphite metal layer 220 through an acid treatment. In an example embodiment, when the substrate 210 formed with the graphene thin film 260 is sequentially dipped in a HF solution and a TFG solution, the silicon oxide 215 and the graphite metal layer 220 may be sequentially removed to completely separate the graphene thin film 260 of a sheet-shape from the substrate 210. The graphene thin film 260 separated from the substrate 210 may be used as the graphene thin film 30 in the electronic devices 100 and 100' of FIGS. 1A and 1B.

Experimental Example

Manufacturing of Device

An organic bistable memory device was manufactured according to the method described with reference to FIGS. 2 and 3.

A $SiO_2$ substrate was washed with DI-water after impurities of the $SiO_2$ substrate were removed through an ultrasonic treatment in acetone and ethanol solution. The washed $SiO_2$ substrate was dried with a high pressure $N_2$ gas, and then Ni was deposited to have a thickness of about 200 nm or more using a thermal evaporator. The $SiO_2$ substrate deposited with Ni was put into a CVD chamber, and then a mixed gas of hydrogen and argon having a ratio of about 1:4 was filled from the vacuum state to maintain the normal pressure in the chamber. After the temperature was increased to about 800° C. with the normal pressure maintained, $CH_4$ gas and the mixed gas of hydrogen and argon were allowed to flow at about 50 sccm and about 200 sccm, respectively, and then cooled to the normal temperature at a rate of about 10° C. per second, forming graphene on the $SiO_2$ substrate.

After coating the graphene thin film grown on the Ni substrate with chlorobenzene solution dissolved with 10 wt % PMMA having a molar mass of about 950,000, and then performing spin-coating for about 120 seconds at a rate of about 4,000 rpm, a PMMA thin film was formed as an insulator on the graphene thin film by removing solvent with heat. Thereafter, $SiO_2$ was etched using HF, and Ni was etched using TFG to obtain the PMMA/graphene thin film structure as shown in FIG. 3B.

As described in operation S11 of FIG. 2, an ITO thin film serving as a bottom electrode was formed through sputtering process on a PET substrate, impurities of which were removed.

The PMMA/graphene structure manufactured in the previous process was attached onto the ITO thin film. The PMMA/graphene structure attached onto the ITO thin film by the Van der Waals forces would not be easily detached from each other because the Van der Waals forces are very strong.

Figure 10:
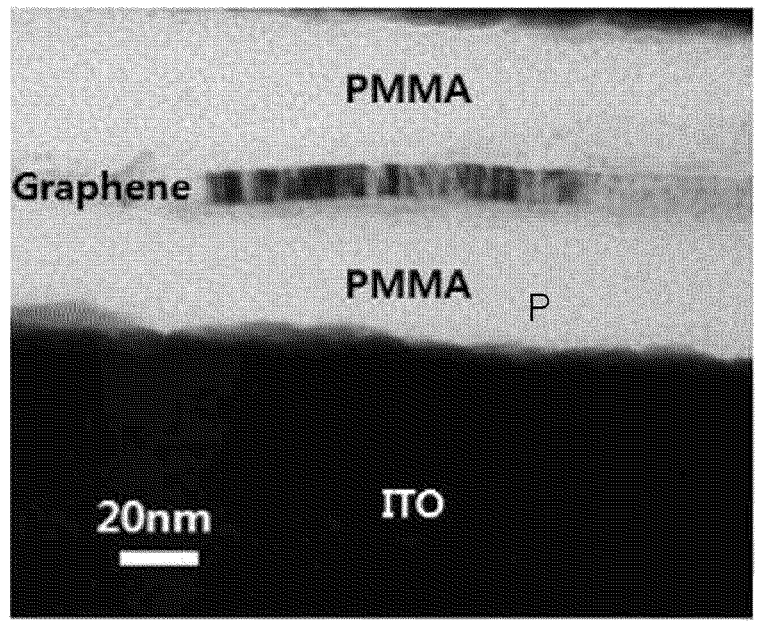
FIG. 10 is a Transmission Electron Microscope (TEM) photo illustrating a PMMA/graphene/PMMA structure in an organic bistable memory device manufactured according to the example embodiment of the inventive concepts.

After dropping chlorobenzene solution dissolved with 10 wt % PMMA having a molar mass of about 950,000 on the graphene thin film and performing spin-coating for about 120 second at a rate of about 4,000 rpm, an upper PMMA thin film serving as an upper insulator was formed as shown in FIG. 3D by removing solvent with heat. The formed structure of PMMA/graphene/PMMA has distinct layers without a mutual diffusion between layers as shown in a TEM photo of FIG. 10.

Next, aluminum (Al) serving as an upper electrode was deposited on the PMMA thin film through thermal evaporation, and peripheral circuit was formed to complete the memory device 100.

Experimental Example

Driving of Manufactured Device

Figure 11:
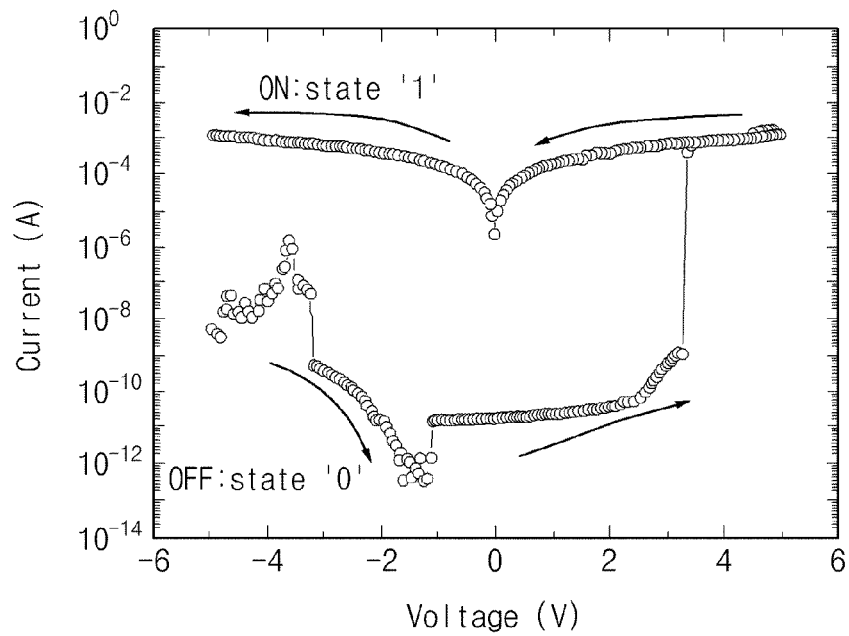
FIG. 11 is a current-voltage curve measured in an organic bistable memory device manufactured according to the example embodiment of the inventive concepts.

FIG. 11 is a current-voltage curve measured in an organic bistable memory device of the structure of FIG. 1A manufactured by the above method.

In FIG. 1A, a positive voltage (+) is applied to the ITO electrode at a bottom, and a negative voltage (−) is applied to the Al electrode at the top to form a circuit. A high conductivity state is defined as '1', and a low conductivity state is defined as '0'.

A write voltage $V_\Omega$ may be set to 5 V, a read voltage $V_P$ may be set to 2 V, and an erase voltage $V_E$ may be set to −5 V. In this case, the respective driving voltages are not regulated but may be set as values enabling write, read, and erase operations. The read voltage may be set to a value of a highest on/off current ratio to reduce an influence by a current noise during the read operation.

A write voltage $V_\Omega$ may be applied for a write operation. In this case, electrons may be trapped in a graphene layer, and resistance may be reduced. Accordingly, current flowing in a device may increase, and the device may be converted from a state of '0' to a state of '1'. A read voltage $V_P$ may be applied to perform a read operation in the state '1'. In this case, the current flowing in the device may become $I_{ON}$.

An erase voltage $V_E$ may be applied for an erase operation. Electrons trapped in the graphene layer may be discharged, and the state of the device may be converted from '1' to '0'. A read voltage $V_P$ may be applied to perform a read operation in the state of '0'. In this case, the current flowing in the device may become $I_{OFF}$, which is much smaller than $I_{ON}$. The driving circuit may sense such a difference between the currents to determine the state of the device.

Figure 12:
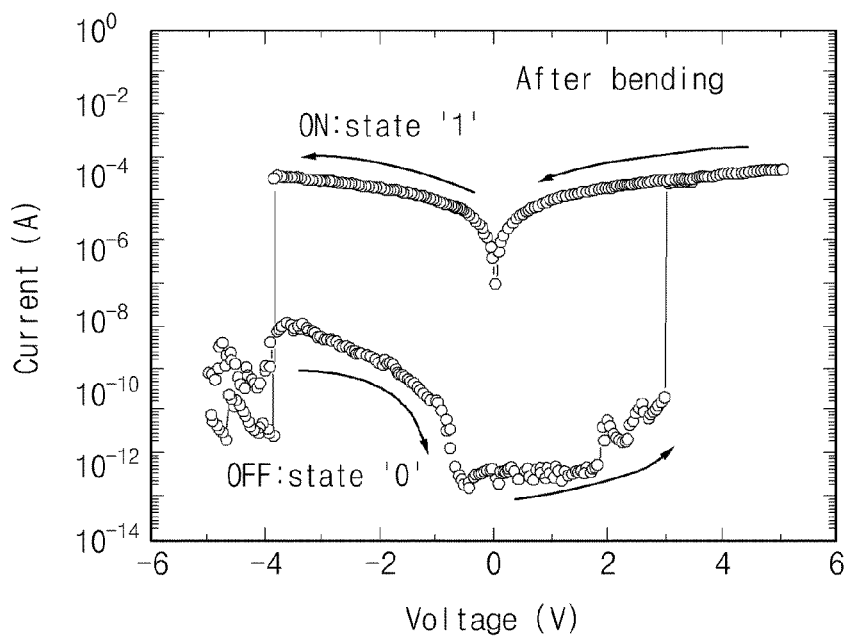
FIG. 12 is a current-voltage curve measured after a bending test is performed on an organic bistable memory device manufactured according to an example embodiment of the inventive concepts.

On the other hand, after a bending (or flexibility) test was performed on the device, I-V characteristics were measured. The bending test was performed by bending the device to have a diameter of about 1 cm. FIG. 12 illustrates an I-V curve after the bending test, which shows there is little difference from the I-V curve of FIG. 11 before the bending test. This shows the device has durability in that the characteristics of the device are not changed even by bending.

Figure 13:
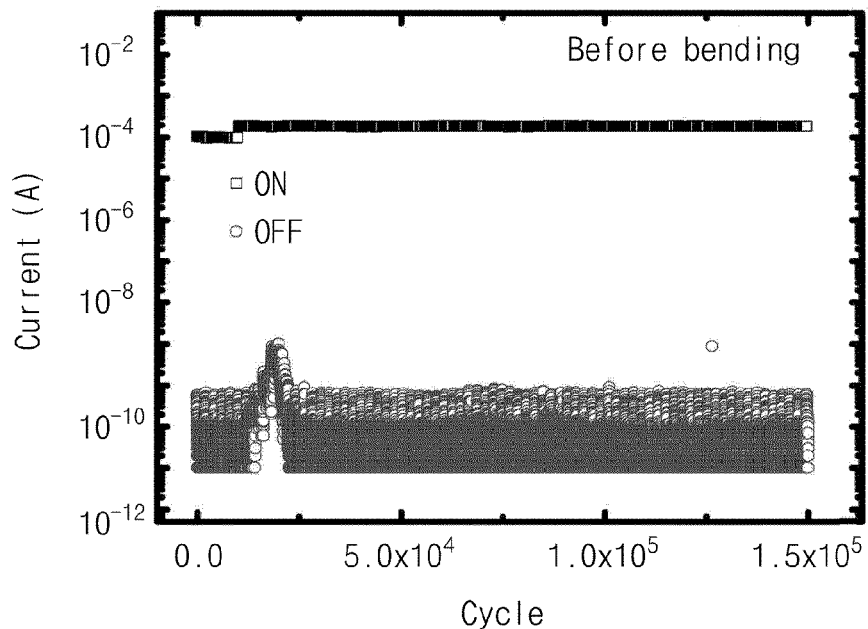
FIG. 13 is a cycling-current curve before bending an organic bistable memory device manufactured according to an example embodiment of the inventive concepts.
Figure 14:
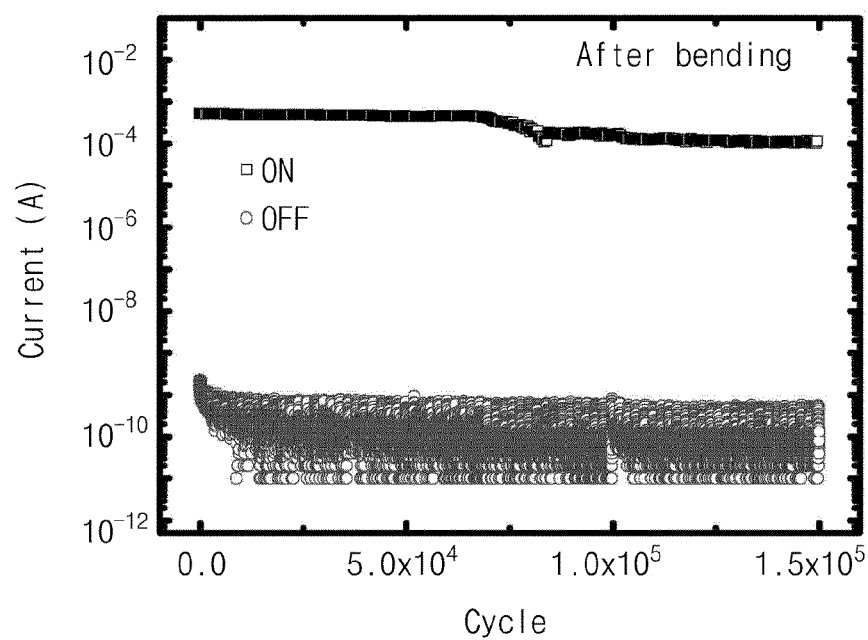
FIG. 14 is a cycling-current curve after bending an organic bistable memory device manufactured according to the example embodiment of the inventive concepts.

Cycling tests on the device were performed before and after bending. FIG. 13 is a cycling-current curve before bending, and FIG. 14 is a cycling-current curve after bending. It can be understood that on/off current rate is maintained enough large during 1.5E5 times both before and after bending, which means excellent cycle durability and thereby, stability of the device.

An electronic device according to an example embodiment of the inventive concepts may include a sandwich structure in which a graphene thin film is disposed between insulators. Typical graphene has been used as electron transport layers and electrodes in photovoltaic devices such as solar cells or photodetectors, and used as channels in switching devices such as transistors because of its high electrical conductivity. The electronic device according to the example embodiment of the inventive concepts may have a new structure because using the sandwich structure including a graphene thin film having increased electrical conductivity between insulators. The sandwich structure may allow determination of memory state of devices such as organic bistable memory devices to become more advantageous, and may be applied to ultrahigh-speed, high-capacity, and low-power memory devices. The electronic device can be utilized as large-capacity memory of devices of portable electronics, and replace typical disk-type memory devices. Also, the electronic device can be applied to flexible portable memory devices by using its flexibility.

Unlike the typical PMMA/graphene structure process method, a method of fabricating an electronic device according to the example embodiments of the inventive concepts may form an insulator as a protection layer to move a graphene thin film, and then use the insulator as it is without removing the insulator. When a memory layer of a sandwich structure in which a graphene thin film exists between insulators is formed, a structure of an insulator/graphene thin film for moving graphene may be used as it is. Accordingly, because devices can be fabricated by a fairly simple process, processes and time for fabricating the devices can be reduced.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An electronic device, comprising:
    a device-substrate;
    a stacked structure including a graphene thin film between a first insulator and a second insulator;
    an electrode over the stacked structure and contacting an upper surface of the second insulator; and
    a conductive layer between the device-substrate and the stacked structure and contacting a lower surface of the first insulator, the graphene thin film not contacting both the electrode and the conductive layer,
    wherein the electrode and the conductive layer are transparent.

2. The electronic device of claim 1, wherein the conductive layer is a bottom electrode.

3. The electronic device of claim 1, wherein the conductive layer is a source/drain region.

4. The electronic device of claim 2, wherein the bottom electrode includes at least one selected from the group consisting of indium tin oxide (ITO), Al-doped ZnO (AZO), Ga-doped ZnO (GZO), Mg-doped ZnO (MGO), Mo-doped ZnO, In, Ga-codoped ZnO (IGZO), and combinations thereof.

5. The electronic device of claim 1, wherein the electrode includes at least one selected from the group consisting of Al, Au, Cu, Pt, Ag, W, Ni, Zn, Ti, Zr, Hf, Cd, Pd, alloys and combinations thereof.

6. The electronic device of claim 1, wherein the first insulator includes at least one selected from poly vinyl pyrrolidone (PVP), polystyrene (PS), poly methyl methacrylate (PMMA), polyimide (PI) and combinations thereof.

7. The electronic device of claim 1, wherein the graphene thin film has a sheet-shape and is formed through graphene deposition using a vapor carbon supply source.

8. An electronic device, comprising:
    a conductive layer on a device-substrate;
    a first insulator over the conductive layer;
    a graphene thin film over the first insulator;
    a second insulator over the graphene thin film, the graphene thin film being mounted to one of the first insulator and the second insulator; and
    an electrode contacting an upper surface of the second insulator, the graphene thin film not contacting both the electrode and the conductive layer,
    wherein the electrode and the conductive layer are transparent.

9. The electronic device of claim 8, wherein the conductive layer is a bottom electrode.

10. The electronic device of claim 9, wherein the bottom electrode includes at least one selected from the group consisting of indium tin oxide (ITO), Al-doped ZnO (AZO), Ga-doped ZnO (GZO), Mg-doped ZnO (MGO), Mo-doped ZnO, In, Ga-codoped ZnO (IGZO), and combinations thereof.

11. The electronic device of claim 8, wherein the conductive layer is a source/drain region.

12. The electronic device of claim 8, wherein the electrode includes at least one selected from the group consisting of Al, Au, Cu, Pt, Ag, W, Ni, Zn, Ti, Zr, Hf, Cd, Pd, alloys and combinations thereof.

13. The electronic device of claim 8, wherein the first insulator and the second insulator include at least one selected from poly vinyl pyrrolidone (PVP), polystyrene (PS), poly methyl methacrylate (PMMA), polyimide (PI) and combinations thereof.

14. The electronic device of claim 8, wherein the graphene thin film has a sheet-shape and is formed through graphene deposition using a vapor carbon supply source.

* * * * *